United States Patent
Wang et al.

(10) Patent No.: US 10,928,050 B2
(45) Date of Patent: Feb. 23, 2021

(54) LIGHT SOURCE STRUCTURE AND LIGHTING DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Qinghe Wang, Beijing (CN); Leilei Cheng, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 51 days.

(21) Appl. No.: 16/413,271

(22) Filed: May 15, 2019

(65) Prior Publication Data
US 2020/0049336 A1     Feb. 13, 2020

(30) Foreign Application Priority Data

Aug. 9, 2018   (CN) .......................... 201810907036.6

(51) Int. Cl.
*F21V 23/02* (2006.01)
*H01L 31/0224* (2006.01)
*H02S 40/34* (2014.01)

(52) U.S. Cl.
CPC .... *F21V 23/023* (2013.01); *H01L 31/022425* (2013.01); *H02S 40/34* (2014.12)

(58) Field of Classification Search
CPC .............................. F21V 23/023; H01L 25/167
See application file for complete search history.

(56) References Cited

U.S. PATENT DOCUMENTS

| 4,209,852 A | 6/1980 | Hyatt |
| 7,635,214 B2 * | 12/2009 | Perlo .................. G09F 19/22 |
| | | 362/551 |
| 2002/0047173 A1 | 4/2002 | Okawa et al. |

FOREIGN PATENT DOCUMENTS

| CN | 2319672 Y | 5/1999 |
| CN | 1289220 A | 3/2001 |
| CN | 102102830 A | 6/2011 |
| CN | 106488628 A | 3/2017 |
| CN | 107676703 A | 2/2018 |
| JP | 2003007479 A | 1/2003 |

OTHER PUBLICATIONS

First Office Action for Chinese Application No. 201810907036.6, dated May 22, 2020, 7 Pages.

\* cited by examiner

*Primary Examiner* — Joseph L Williams
*Assistant Examiner* — Jacob R Stern
(74) *Attorney, Agent, or Firm* — Brooks Kushman P.C.

(57) ABSTRACT

Provided are a light source structure and a light-emitting device. The light source structure includes a power supply unit, a field effect unit and a light-emitting unit, wherein the power supply unit supplies power to the field effect unit and the light-emitting unit; and the field effect unit includes a vibrator unit that receives sound waves from the outside to generate vibration, so that the field effect unit generates a current varying along with the vibration, and supplies the varying current to the light-emitting unit to generate light with variable light intensity.

18 Claims, 3 Drawing Sheets

LIGHT SOURCE STRUCTURE AND LIGHTING DEVICE

CROSS-REFERENCE TO RELATED APPLICATION

This application claims priority to Chinese Patent Application No. 201810907036.6 filed on Aug. 9, 2018, which is incorporated herein by reference in its entirety.

TECHNICAL FIELD

The present disclosure relates to the field of lighting technology, and in particular, to a light source structure and a lighting device.

BACKGROUND

In daily life, acoustic and vibration signals are ubiquitous. Examples of acoustic and vibration signals include: noise and vibration from road cars, airplanes on airports; pleasing vocals; and noisy machine sound waves and vibrations. All signals related to sound waves or vibrations are also a usable resource, but the use thereof is blank currently. It is a sensible measure to be capable of utilizing the resources related to sound waves or vibrations. Therefore, there is a need for developing and designing products capable of utilizing these resources.

SUMMARY

In one aspect, the present disclosure provides a light source structure, including a power supply unit, a field effect unit and a light-emitting unit, in which the power supply unit supplies power to the field effect unit and the light-emitting unit; and the field effect unit includes a vibrator unit that receives sound waves from the outside to generate vibration, so that the field effect unit generates a current varying along with the vibration, and supplies the varying current to the light-emitting unit to generate light with varying light intensity.

Optionally, the field effect unit includes the vibrator unit, a semiconductor layer, a second electrode layer and a third electrode layer; the vibrator unit includes a thin-film layer, a first electrode layer, a first insulating layer and a second insulating layer arranged in sequence, in which the first insulating layer is configured to be partially hollow such that a hollow interlayer is formed between the first electrode layer and the second insulating layer; and the semiconductor layer is arranged on a side of the vibrator unit away from the thin-film layer, and both the second electrode layer and the third electrode layer are arranged on a side of the semiconductor layer away from the vibrator unit.

Optionally, the light-emitting unit is arranged on a side of the second insulating layer away from the first electrode layer, and the light-emitting unit includes an anode layer, a light-emitting layer and a cathode layer arranged in sequence, and the anode layer and the semiconductor layer are arranged in a same layer and electrically connected to the third electrode layer.

Optionally, the light-emitting unit is arranged on a side of the field effect unit away from the first electrode layer and covers the entire surface of the side; and the light-emitting unit includes a third insulating layer, an anode layer, a light-emitting layer, and a cathode layer arranged in sequence, in which the anode layer is electrically connected to the third electrode layer through a via hole in the third insulating layer.

Optionally, the power supply unit is a photovoltaic unit, which is arranged on the cathode layer of the light-emitting unit and includes a fifth insulating layer, a photovoltaic anode layer, a photovoltaic light-absorbing layer and a photovoltaic cathode layer arranged in sequence.

Optionally, the power supply unit is a photovoltaic unit, which is arranged on the cathode layer of the light-emitting unit and includes a fifth insulating layer, a photovoltaic anode layer, a photovoltaic light-absorbing layer and a photovoltaic cathode layer arranged in sequence.

Optionally, the light source structure further includes a control circuit configured to distribute electrical energy between the light-emitting unit and the field effect unit; and the photovoltaic unit is configured to convert external light and light of the light-emitting unit into electrical energy.

Optionally, the light source structure further includes a control circuit configured to distribute electrical energy between the light-emitting unit and the field effect unit; and the photovoltaic unit is configured to convert external light and light of the light-emitting unit into electrical energy.

Optionally, the power supply unit is a photovoltaic unit arranged on a side of the second insulating layer away from the first electrode layer; the photovoltaic unit includes a photovoltaic anode layer, a photovoltaic light-absorbing layer, a photovoltaic cathode layer and a sixth insulating layer arranged in sequence; and the photovoltaic anode layer and the semiconductor layer are arranged in a same layer, and the sixth insulating layer includes at least a side edge portion extending to the second insulating layer and configured to isolate the photovoltaic unit from the third electrode layer.

Optionally, the light-emitting unit is arranged on the sixth insulating layer of the photovoltaic unit; and the light-emitting unit includes an anode layer, a light-emitting layer and a cathode layer arranged in sequence, in which the anode layer includes a side edge portion extending to the third electrode layer, and an orthogonal projection of the light-emitting unit on the thin-film layer covers an orthogonal projection of the photovoltaic unit on the thin-film layer.

Optionally, the first electrode layer is made of graphene, and both the second electrode layer and the third electrode layer are made of copper or aluminum.

Optionally, both the first insulating layer and the second insulating layer are made of polymethyl methacrylate or polystyrene.

Optionally, the anode layer is made of indium tin oxide, the light-emitting layer is made of an organic semiconductor material, and the cathode layer is made of aluminum.

Optionally, the photovoltaic anode layer is made of indium tin oxide, the photovoltaic light-absorbing layer is made of an organic semiconductor material, and the cathode layer is made of aluminum.

In another aspect, the present disclosure provides a lighting device including the above light source structure.

DETAILED DESCRIPTION

The disclosure will be described in detail below with reference to the drawings and embodiments. It will be understood that the specific embodiments herein are merely used to illustrate and not to limit the present disclosure. It should be noted that the embodiments in the present disclosure and the features in the embodiments can be combined with each other, as long as they do not contradict each other.

In view of the needs in the related art, the present disclosure develops and designs a light source structure and a lighting device, which are capable of utilizing a signal source such as noise/sound wave/vibration to realize the variability of the light source intensity or generate variable light intensity, thereby satisfying different kinds of needs for the light source.

According to an aspect of the present disclosure, the present disclosure provides a light source structure, including a power supply unit, a field effect unit, and a light-emitting unit, in which the power supply unit supplies power to the field effect unit and the light-emitting unit; and the field effect unit includes a vibrator unit that receives sound waves from the outside to generate vibration, so that the field effect unit generates a current varying along with the vibration, and supplies the varying current to the light-emitting unit to generate light with varying light intensity.

Figure 1:
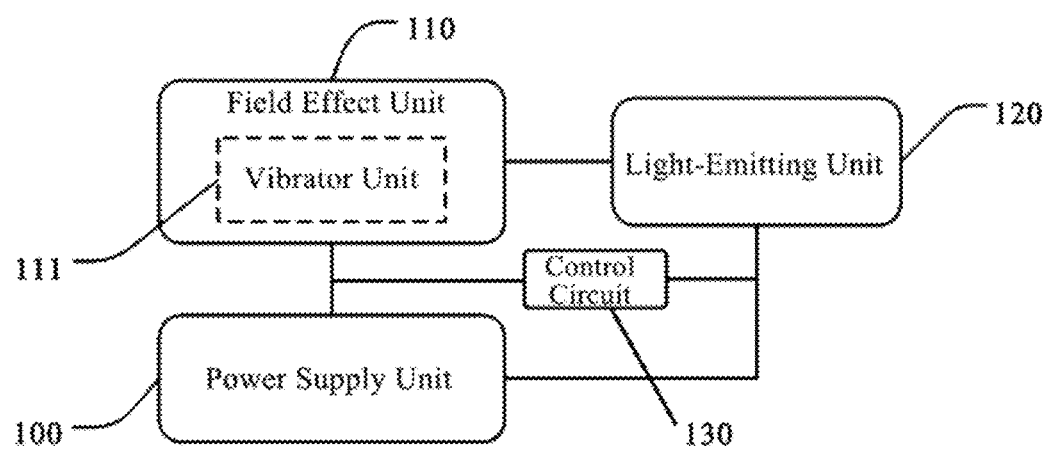
FIG. 1 shows an exemplary structural diagram of a light source structure according to one embodiment of the present disclosure.

FIG. 1 shows an exemplary structural diagram of a light source structure according to the present disclosure. As shown in FIG. 1, a light source structure includes a power supply unit 100, a field effect unit 110, and a light-emitting unit 120. The power supply unit 100 supplies power to the field effect unit 110 and the light-emitting unit 20. The field effect unit 110 includes a vibrator unit 111 that receives sound waves from the outside to generate vibration, so that the field effect unit generates a current varying along with the vibration, and supplies the varying current to the light-emitting unit 120 to generate light with varying light intensity.

Optionally, the light source structure further includes a control circuit 130 configured to distribute electrical energy between the light-emitting unit and the field effect unit.

The vibrator unit generates a vibration swing along with the external acoustic signal, such that the current of the field effect unit changes. The light intensity of the light-emitting unit varies under the influence of the varying current. It should be noted that the power supply unit can supply power to the field effect unit and the light-emitting unit through a control circuit according to the application scenario. The more the power supplied to the field effect unit, the stronger the influence of external sound waves on the light intensity of the light-emitting unit, and it is even possible to supply power to the field effect unit to increase the variation of the light intensity.

In an optional embodiment according to the present disclosure, the field effect unit includes the vibrator unit, a semiconductor layer, a second electrode layer, and a third electrode layer; the vibrator unit includes a thin-film layer, a first electrode layer, a first insulating layer and a second insulating layer arranged in sequence, in which the first insulating layer is configured to be partially hollow such that a hollow interlayer is formed between the first electrode layer and the second insulating layer; and the semiconductor layer is arranged on a side of the vibrator unit away from the thin-film layer, and both the second electrode layer and the third electrode layer are arranged on a side of the semiconductor layer away from the vibrator unit.

In the first embodiment of the present disclosure, the light-emitting unit is arranged on a side of the second insulating layer away from the first electrode layer; and the light-emitting unit includes an anode layer, a light-emitting layer, and a cathode layer arranged in sequence, and the anode layer and the semiconductor layer are arranged in a same layer and electrically connected to the third electrode layer.

Figure 2:
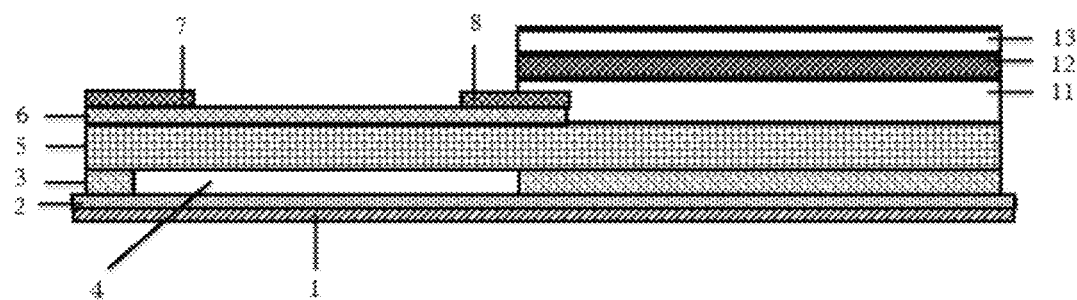
FIG. 2 shows an exemplary structural diagram of a light source structure according to the first embodiment of the present disclosure.

FIG. 2 shows an exemplary structural diagram of a light source structure according to the first embodiment of the present disclosure. As shown in FIG. 2, the field effect unit 110 includes the vibrator unit 111, a semiconductor layer 6, a second electrode layer 7, and a third electrode layer 8. The vibrator unit 11 includes a thin-film layer 1, a first electrode layer 2, a first insulating layer 3, and a second insulating layer 5, in which the first insulating layer 3 is configured to be partially hollow such that a hollow interlayer 4 is formed between the first electrode layer 2 and the second insulating layer 5. The semiconductor layer 6 is arranged on a side of the vibrator unit 111 away from the first electrode layer 2. Optionally, the semiconductor layer 6 is arranged on a partial surface of a side of the vibrator unit 111. For example, it covers the surface of the left portion of the second insulating layer 5 as shown in FIG. 2. Both the second electrode layer and the third electrode layer are arranged on a side of the semiconductor layer away from the vibrator unit. Optionally, the second electrode layer 7 and the third electrode layer 8 are respectively arranged on the surfaces of the left and right end portions of the semiconductor layer 6. Optionally, the first electrode layer 2 may be a gate layer, the second electrode layer 7 may be a source layer, and the third electrode layer 8 may be a drain layer.

As shown in FIG. 2, the light-emitting unit 120 is arranged on a side of the second insulating layer 5 away from the first electrode layer 2; and the light-emitting unit 120 includes an anode layer 11, a light-emitting layer 12, and a cathode layer 13 arranged in sequence, and the anode layer 11 and the semiconductor layer 6 are arranged in a same layer and electrically connected to the third electrode layer.

In the light source structure according to the embodiment of the present disclosure, by applying a voltage to the first electrode layer 2, the second electrode layer 7, and the anode layer 8 through an external circuit, the light intensity of the light emitted by the light source structure may vary along with the external sound wave. Specifically, when the light source structure receives vibration for example an acoustic wave signal, the vibrator unit is vibrated by the acoustic wave, so that the hollow space of the hollow interlayer 4 varies, that is, the distance between the first electrode layer 2 and the second insulating layer 5 varies. Thus, the capacitance between the semiconductor layer 6 and the first electrode layer 2 varies, and the current flowing through the second electrode layer 7 or the third electrode layer 8 varies. The current of the anode layer 11 of the light-emitting unit 120 also varies, resulting in a variation in the intensity of the emitted light. Optionally, the magnitude and variation of the light intensity can be adjusted by controlling the current supplied to the field effect unit.

In the second embodiment of the present disclosure, the light-emitting unit is arranged on a side of the second insulating layer away from the first electrode layer and covers the entire surface of the side; and the light-emitting unit includes a third insulating layer, an anode layer, a light-emitting layer, and a cathode layer arranged in sequence, in which the anode layer is electrically connected to the third electrode layer through a via hole in the third insulating layer.

Figure 3:
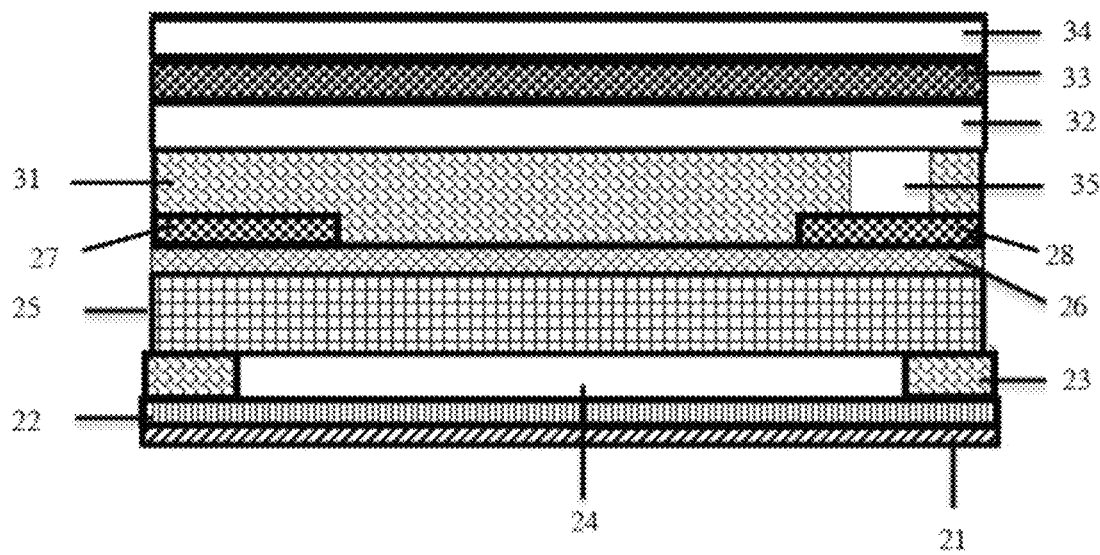
FIG. 3 shows an exemplary structural diagram of a light source structure according to the second embodiment of the present disclosure.

FIG. 3 shows an exemplary structural diagram of a light source structure according to the above second embodiment. As shown in FIG. 3, the field effect unit includes the vibrator unit 111, a semiconductor layer 26, a second electrode layer 27, and a third electrode layer 28. The vibrator unit 11 includes a thin-film layer 21, a first electrode layer 22, a first insulating layer 23, and a second insulating layer 25. The first insulating layer 23 is configured to be partially hollow such that a hollow interlayer 24 is formed between the first electrode layer 22 and the second insulating layer 25. The semiconductor layer 26 is arranged on a side of the second insulating layer 25 of the vibrator unit 111 away from the first electrode layer 22. Optionally, the semiconductor layer 26 covers the entire surface of the second insulating layer 25. A second electrode layer 27 and a third electrode layer 28 are respectively arranged on the surfaces of the left and right end portions of the semiconductor layer 26. Optionally, the first electrode layer 22 may be a gate layer, the second electrode layer 27 may be a source layer, and the third electrode layer 28 may be a drain layer.

As shown in FIG. 3, the light-emitting unit 120 is arranged to be overlapped on the field effect unit 110, and the light-emitting unit 120 includes a third insulating layer 31, an anode layer 32, a light-emitting layer 33, and a cathode layer 34 arranged in sequence, and the anode layer 32 is electrically connected to the third electrode layer 28 through the via hole 35 of the third insulating layer 31.

In the light source structure according to the embodiment of the present disclosure, by applying a voltage to the first electrode layer 22, the second electrode layer 27, and the anode layer 28 through an external circuit, the light intensity of the light emitted by the light source structure may vary along with the external sound wave. The working principle is similar to that of the first embodiment, and details are not described herein again.

Figure 4:
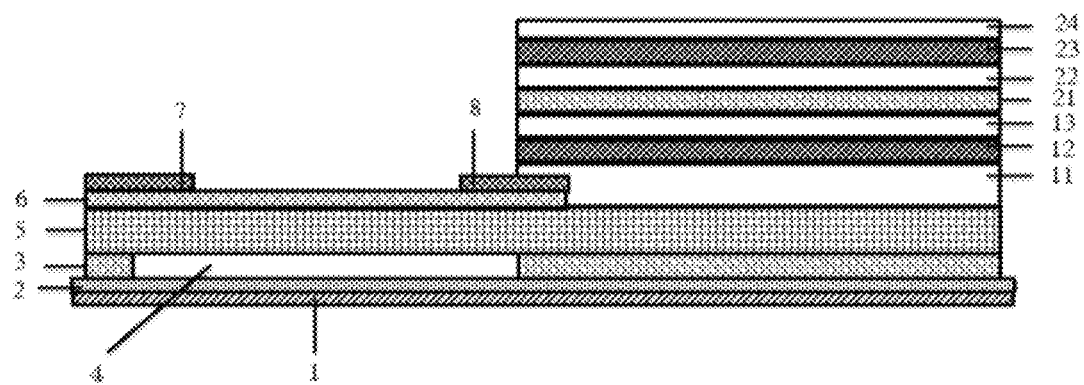
FIG. 4 shows an exemplary structural diagram of a light source structure according to the third embodiment of the present disclosure.
Figure 5:
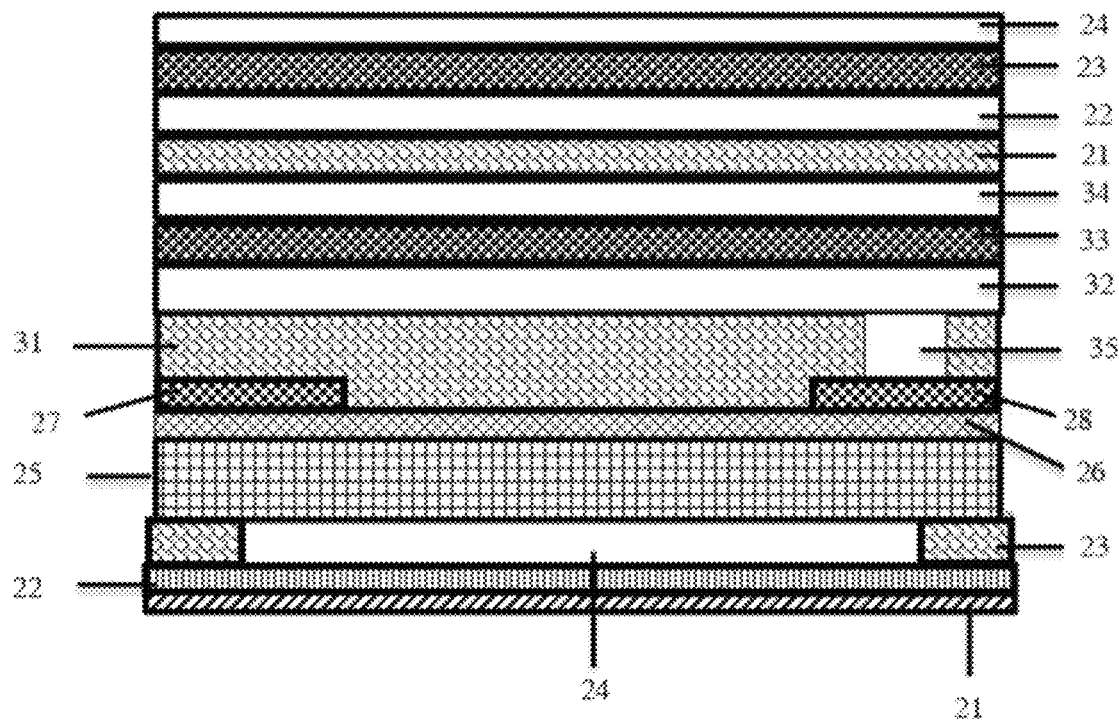
FIG. 5 shows an exemplary structural diagram of a light source structure according to the fourth embodiment of the present disclosure.

FIG. 4 shows an exemplary structural diagram of a light source structure according to the third embodiment of the present disclosure. FIG. 5 shows an exemplary structural diagram of a light source structure according to the fourth embodiment of the present disclosure. As shown in FIGS. 4 and 5, the power supply unit 100 is a photovoltaic unit (not shown), which is arranged on the cathode layer of the light-emitting unit and includes a fifth insulating layer 21, a photovoltaic anode layer 22, a photovoltaic light-absorbing layer 23 and a photovoltaic cathode 24 layer arranged in sequence. The difference between the light source structure of the third embodiment shown in FIG. 4 and the light source structure of the first embodiment shown in FIG. 2 lies in the difference of the power supply unit. The difference between the light source structure of the third embodiment shown in FIG. 5 and the light source structure of the first embodiment shown in FIG. 3 lies in the difference of the power supply unit.

The photovoltaic unit converts the external light and the light from the light-emitting unit into electrical energy, and supplies power to the light-emitting unit and the field effect unit through the control circuit. A control circuit is configured to distribute electrical energy between the light-emitting unit and the field effect unit. The light source structure according to one embodiment of the present disclosure achieves a self-power supply effect.

Different intensity of light is irradiated on the photovoltaic unit to generate corresponding photovoltaic behavior, and converted into electrical energy, thereby realizing the electrical energy storage and continuous power supply to the field effect unit and the light-emitting unit. The photovoltaic unit, the field effect unit and the light-emitting unit are mutually beneficial and mutually integrated. Under the effect of different acoustic signal strengths, the swing of the vibration film can obtain light of different light intensities. Light with a specified light intensity distribution is obtained by adjusting the control circuit, to meet the requirements for large and efficient light conversion of the photovoltaic unit. In this process, the acoustic signal is converted into electrical energy by the light source structure of the present disclosure, to achieve reuse of the acoustic signal and the light-emitting signal.

Figure 6:
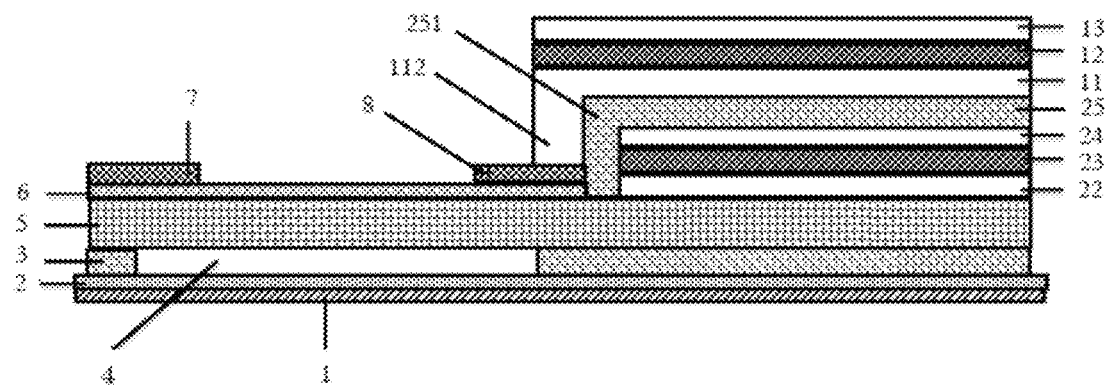
FIG. 6 shows an exemplary structural diagram of a light source structure according to the fifth embodiment of the present disclosure.

FIG. 6 shows an exemplary structural diagram of a light source structure according to the fifth embodiment of the present disclosure. As shown in FIG. 6, the power supply unit is a photovoltaic unit arranged on a side of the second insulating layer 5 away from the first electrode layer. The photovoltaic unit includes a photovoltaic anode layer 22, a photovoltaic light-absorbing layer 23, a photovoltaic cathode layer 24, and a sixth insulating layer 25 arranged in sequence. The photovoltaic anode layer 22 and the semiconductor layer 6 are arranged in a same layer, and the sixth insulating layer 25 includes at least a side edge portion 251 extending to the second insulating layer for isolating the photovoltaic unit from the third electrode layer 8.

The light-emitting unit is arranged above the photovoltaic unit. The light-emitting unit includes an anode layer 11, a light-emitting layer 12, and a cathode layer 13 arranged in sequence. The anode layer 11 includes a side edge portion 112 extending to the third electrode layer. The orthogonal projection of the light-emitting unit on the thin-film layer 2 covers the orthogonal projection of the photovoltaic unit on the thin-film layer 2.

The photovoltaic unit converts the external light and the light from the light-emitting unit into electrical energy, and supplies power to the light-emitting unit and the field effect unit through the control circuit. A control circuit is configured to distribute electrical energy between the light-emitting unit and the field effect unit. In view of this, the present disclosure fully utilizes external acoustic signals such as noise and vibration to achieve a variation in the light intensity, and further converts the variation in the light intensity into electrical energy storage. This indirectly converts the external sound wave signal into electrical energy, and reuses these signals to turn waste into treasure.

In some embodiments, the first electrode layer is made of graphene, and both the second electrode layer and the third electrode layer are made of copper or aluminum.

In some embodiments, both the first insulating layer and the second insulating layer are made of polymethyl methacrylate or polystyrene.

In some embodiments, the anode layer is made of indium tin oxide, the light-emitting layer is made of an organic semiconductor material, and the cathode layer is made of aluminum.

In some embodiments, the photovoltaic anode layer is made of indium tin oxide, the photovoltaic light-emitting layer is made of an organic semiconductor material, and the cathode layer is made of aluminum.

According to another embodiment of the present disclosure, there is also provided a lighting device including a light source structure provided by various embodiments of the present disclosure.

The light-emitting device of the present disclosure can change the light intensity by an acoustic signal and can achieve self powering. Therefore, the lighting device of the present disclosure can fully utilize road and airport noise to realize road lighting and airport lighting; and fully utilize the vibration signal of the vehicle body, for example, the vibration of the vehicle body or the acoustic signal generated by the vehicle body due to continued vibration, to realize the lighting for the car at night driving or other car's position, or to realize other signal lighting, etc. Meanwhile, the remaining power stored in the light source device itself can be used for daily power consumption on the vehicle, and the lighting device may serve as a reserve power source. In addition, the light-emitting device of the present disclosure can also be used in the field of free experience, for example, the product experiencer uses his own voice to change the optical signal at his will desired, and also for the emerging product types such as emotional venting. The light-emitting device can also be applied to the field of signal transmission, that is, by controlling the change in the light intensity and the rules for the change in the light intensity, a light intensity signal may be changed in a manner similar to the "moss code" to convey the signal. For example, these specific signals for compiling rules, such as for whether the ship can be docked, whether the aircraft can take off and land, and whether the vehicle can drive in, can be transmitted by changing the rules of light intensity. Only a few specific application examples are given above, but the field of application is not limited to this.

The manufacturing method of the light source structure of the present disclosure is described below by taking the light source structure of FIG. 4 as an example, and specifically includes the following steps S1-S8.

Step S1: a glass plate was selected as a substrate.

Step S2: the prepared film of polymethyl methacrylate (first insulating layer) with a layer of graphene (first electrode layer) was transferred onto a glass substrate.

Step S3: a negative photoresist was coated, exposed, and developed to pattern the first insulating layer to form a hollow pattern.

Step S4: one layer of a polymer thin film (second insulating layer) was deposited onto the first insulating layer, and then a semiconductor (e.g., indium gallium zinc oxide) layer, a second electrode layer (e.g., Cu or Al), and a third electrode layer (Cu or Al) were prepared.

Step S5: an anode layer (for example, indium tin oxide), a light-emitting layer (organic semiconductor layer), and a cathode layer (for example, aluminum) of the light-emitting unit were prepared, in which the anode layer was connected to the third electrode layer of the field effect unit.

Step S6: a layer of silicon oxide was prepared as a fifth insulating layer on the cathode layer of the light-emitting unit.

Step S7: a photovoltaic anode layer (for example, indium tin oxide), a light-absorbing layer, and a cathode layer (for example, aluminum) of the photovoltaic unit is prepared on the fifth insulating layer.

Step S8: The substrate was separated from the thin-film sheet using a diluted KOH (potassium hydroxide) solution.

The above descriptions are merely optional embodiments of the disclosure and description of the applied technical principles. A person skilled in the art should understand that the scope of the invention referred to in the disclosure is not limited to the technical solutions specifically combined by the above technical features, but also covers other technical solutions formed by any combination of the above technical features or the equivalent features thereof without departing from the inventive concept, e.g., the technical solution formed by the interchange of the above features and the technical features having similar functions, disclosed in (but not limited to) the disclosure.

What is claimed is:

1. A light source structure, comprising a power supply unit, a field effect unit, and a light-emitting unit,
wherein the power supply unit supplies power to the field effect unit and the light-emitting unit;
wherein the field effect unit comprises a vibrator unit, a semiconductor layer, a second electrode layer, and a third electrode layer, and the vibrator unit receives sound waves from the outside to generate vibration so that the field effect unit generates a current varying along with the vibration, and supplies the varying current to the light-emitting unit to generate light with variable light intensity;
wherein the vibrator unit comprises a thin-film layer, a first electrode layer, a first insulating layer and a second insulating layer arranged in sequence, in which the first insulating layer is configured to be partially hollow such that a hollow interlayer is formed between the first electrode layer and the second insulating layer; and
wherein the semiconductor layer is arranged on a side of the vibrator unit away from the thin-film layer, and both the second electrode layer and the third electrode layer are arranged on a side of the semiconductor layer away from the vibrator unit.

2. The light source structure of claim 1, wherein the light-emitting unit is arranged on a side of the second insulating layer away from the first electrode layer; and
wherein the light-emitting unit comprises an anode layer, a light-emitting layer, and a cathode layer arranged in sequence, and the anode layer and the semiconductor layer are arranged in a same layer and electrically connected to the third electrode layer.

3. The light source structure of claim 2, wherein the power supply unit is a photovoltaic unit, which is arranged on the cathode layer of the light-emitting unit and comprises a fifth insulating layer, a photovoltaic anode layer, a photovoltaic light-absorbing layer and a photovoltaic cathode layer arranged in sequence.

4. The light source structure of claim 3, wherein the light source structure further comprises a control circuit configured to distribute electrical energy between the light-emitting unit and the field effect unit; and wherein the photovoltaic unit is configured to convert external light and light of the light-emitting unit into electrical energy.

5. The light source structure of claim 2, wherein the anode layer is made of indium tin oxide, the light-emitting layer is made of an organic semiconductor material, and the cathode layer is made of aluminum.

6. The light source structure of claim 1, wherein the light-emitting unit is arranged on a side of the field effect unit away from the first electrode layer and covers the entire surface of the side; and
wherein the light-emitting unit comprises a third insulating layer, an anode layer, a light-emitting layer, and a cathode layer arranged in sequence, in which the anode layer is electrically connected to the third electrode layer through a via hole in the third insulating layer.

7. The light source structure of claim 6, wherein the power supply unit is a photovoltaic unit, which is arranged on the cathode layer of the light-emitting unit and comprises a fifth insulating layer, a photovoltaic anode layer, a photovoltaic light-absorbing layer and a photovoltaic cathode layer arranged in sequence.

8. The light source structure of claim 7, wherein the light source structure further comprises a control circuit configured to distribute electrical energy between the light-emitting unit and the field effect unit; and wherein the photovoltaic unit is configured to convert external light and light of the light-emitting unit into electrical energy.

9. The light source structure of claim 7, wherein the photovoltaic anode layer is made of indium tin oxide, the photovoltaic light-absorbing layer is made of an organic semiconductor material, and the cathode layer is made of aluminum.

10. The light source structure of claim 1, wherein the power supply unit is a photovoltaic unit arranged on a side of the second insulating layer away from the first electrode layer;
wherein the photovoltaic unit comprises a photovoltaic anode layer, a photovoltaic light-absorbing layer, a photovoltaic cathode layer and a sixth insulating layer arranged in sequence; and
wherein the photovoltaic anode layer and the semiconductor layer are arranged in a same layer, and the sixth insulating layer comprises at least a side edge portion extending to the second insulating layer and configured to isolate the photovoltaic unit from the third electrode layer.

11. The light source structure of claim 10, wherein the light-emitting unit is arranged on the sixth insulating layer of the photovoltaic unit; and
wherein the light-emitting unit comprises an anode layer, a light-emitting layer and a cathode layer arranged in sequence, in which the anode layer comprises a side edge portion extending to the third electrode layer, and an orthogonal projection of the light-emitting unit on the thin-film layer covers an orthogonal projection of the photovoltaic unit on the thin-film layer.

12. The light source structure of claim 11, wherein the light source structure further comprises a control circuit configured to distribute electrical energy between the light-emitting unit and the field effect unit; and wherein the photovoltaic unit is configured to convert external light and light of the light-emitting unit into electrical energy.

13. The light source structure of claim 1, wherein the first electrode layer is made of graphene, and both the second electrode layer and the third electrode layer are made of copper or aluminum.

14. The light source structure of claim 1, wherein both the first insulating layer and the second insulating layer are made of polymethyl methacrylate or polystyrene.

15. A lighting device comprising the light source structure of claim 1.

16. The lighting device of claim 15, wherein the light-emitting unit is arranged on a side of the second insulating layer away from the first electrode layer; and
wherein the light-emitting unit comprises an anode layer, a light-emitting layer, and a cathode layer arranged in sequence, and the anode layer and the semiconductor layer are arranged in a same layer and electrically connected to the third electrode layer.

17. The lighting device of claim 15, wherein the light-emitting unit is arranged on a side of the field effect unit away from the first electrode layer and covers the entire surface of the side; and
wherein the light-emitting unit comprises a third insulating layer, an anode layer, a light-emitting layer, and a cathode layer arranged in sequence, in which the anode layer is electrically connected to the third electrode layer through a via hole in the third insulating layer.

18. The lighting device of claim 15, wherein the power supply unit is a photovoltaic unit arranged on a side of the second insulating layer away from the first electrode layer;
wherein the photovoltaic unit comprises a photovoltaic anode layer, a photovoltaic light-absorbing layer, a photovoltaic cathode layer and a sixth insulating layer arranged in sequence; and
wherein the photovoltaic anode layer and the semiconductor layer are arranged in a same layer, and the sixth insulating layer comprises at least a side edge portion extending to the second insulating layer and configured to isolate the photovoltaic unit from the third electrode layer.

* * * * *